(12) United States Patent
Sonkusale et al.

(10) Patent No.: US 6,606,042 B2
(45) Date of Patent: Aug. 12, 2003

(54) TRUE BACKGROUND CALIBRATION OF PIPELINED ANALOG DIGITAL CONVERTERS

(75) Inventors: Sameer Sonkusale, Secane, PA (US); Jan Van der Spiegel, Philadelphia, PA (US); Krishnasawamy Nagaraj, Hillsborough, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/154,358

(22) Filed: May 23, 2002

(65) Prior Publication Data

US 2002/0175843 A1 Nov. 28, 2002

Related U.S. Application Data

(60) Provisional application No. 60/293,036, filed on May 23, 2001.

(51) Int. Cl.$^7$ ................................................ H03M 1/10
(52) U.S. Cl. ........................ 341/120; 341/118; 341/161
(58) Field of Search ................................. 341/120, 118, 341/122, 155, 156, 172, 161

(56) References Cited

U.S. PATENT DOCUMENTS

| | | | |
|---|---|---|---|
| 5,635,937 A | * 6/1997 | Lim et al. | 341/161 |
| 6,184,809 B1 | * 2/2001 | Yu | 341/120 |
| 6,211,806 B1 | * 4/2001 | McCarroll | 341/161 |
| 6,232,898 B1 | 5/2001 | Nagaraj | |
| 6,373,424 B1 | 4/2002 | Soenen | |
| 6,456,211 B2 | * 9/2002 | Wu et al. | 341/120 |

OTHER PUBLICATIONS

Lee, Hae–Seung. A 12–b 600 ks/s Digitally Self–calibrated Pipelined Algorithmic ADC. IEEE Journal of Solid–State Circuits, 29(4): 509–515, Apr. 1994.
Moon, Un–Ku and Song, Bang–Sup. Background Digital Calibration Techniques for Pipelined ADC's. IEEE Trans. Circuits System II, 44(2): 102–109, Feb. 1997.
Ingino, Jr., Joseph and Wooley, Bruce. A Continuously Calibrated 12–b, 10–ms/s. 3.3–v A/D Converter. IEEE Journal of Solid State Circuits, 33(12): 1920–1931, Dec. 1998.
Lewis, Stephen H., et al. A 10–b 20–msample/s Analog–to–Digital Converter. IEEE Journal of Solid State Circuits, 27(3): 351–358, Mar. 1992.
Nagaraj, K. Area–efficient Self–calibration Technique for Pipelined Algorithmic A/D Converters. IEEE Trans. Circuits System II, 43(7): 540–544, Jul. 1996.

* cited by examiner

*Primary Examiner*—Michael Tokar
*Assistant Examiner*—John Nguyen
(74) *Attorney, Agent, or Firm*—W. Daniel Swayze, Jr.; W. James Brady; Frederick J. Telecky, Jr.

(57) ABSTRACT

Systems and methods are provided for performing a background calibration technique on one or more stages of a pipeline Analog-to-Digital Converter (ADC). The systems and methods employs a slow but accurate analog-to-digital converter or a slow but accurate ideal pipeline stage to correct for the residue errors in a non-ideal pipeline stage using an error function and a correction algorithm. The correction algorithm determines optimal parameters of the error function, so that the error function can be utilized to compensate for errors in the ADC. The correction algorithm and results can be applied in the digital domain or in the analog domain.

28 Claims, 7 Drawing Sheets

TRUE BACKGROUND CALIBRATION OF
PIPELINED ANALOG DIGITAL
CONVERTERS

CROSS REFERENCE TO RELATED APPLICATIONS

The present application claims the benefit of U.S. Provisional Patent Application Ser. No. 60/293,036, filed May 23, 2001, entitled TRUE BACKGROUND CALIBRATION OF PIPELINED ANALOG-DIGITAL CONVERTERS, and which is incorporated herein by reference.

TECHNICAL FIELD

The present invention relates to electrical circuits and more particularly to background calibration technique for pipelined analog-to-digital converters (ADCs).

BACKGROUND OF INVENTION

Analog-to-digital conversion is the process of converting an analog data signal, which is most commonly represented as voltage, into a digital format. Determining a digital value which represents a particular analog input is known as "quantization". Serial, delta-sigma or oversampling, parallel, and pipelined are some of the many different analog-to-digital conversion architectures which exist. Different architectures are suited to different needs. Serial analog-to-digital architecture offers the widest range of performance in analog-to-digital conversion, from low power and low resolution to quantizations with very high resolutions. Basic serial architecture quantizes analog data at the rate of one bit per cycle. Therefore, a digital sample having N bits of resolution will take N cycles to fully quantize. Delta-sigma analog-to-digital architecture is used in audio signal processing. The architecture is designed to translate high-speed, low-resolution samples into higher-resolution, lower-speed output. This process is also referred to as oversampling because more samples of the analog data are quantized than actually become output.

Parallel analog-to-digital architecture provides the fastest quantization rate per analog signal. In the parallel architecture, a digital value per cycle is produced for each analog data sample, without regard to N, the number of bits of resolution. Parallel architecture requires that all quantization levels be simultaneously compared to the analog signal. This results in the use of $2^{N-1}$ comparators and $2^{N-1}$ resistors to achieve a digital value, with N bits of resolution, per cycle. Pipelined analog-to-digital architecture is a method of quantizing an analog signal in stages. Algorithms exist for obtaining one or more bits of resolution per stage. For example, in a 1.5-bit per stage converter, the digital output of each stage is either 1, 0, or −1. One bit is resolved at each stage with the resulting analog residue passed along to the next stage for resolution of another bit. After a latency of N cycles, a single digital value for a single analog input is produced. Other methods are able to output more than 1-bit per stage, needing fewer latency cycles to produce a digital value with the same resolution. The use of pipelining permits a high degree of parallelism, so that one complete output per cycle can be produced after the pipeline fills up.

Pipelined ADCs have many applications. They are particularly useful when low voltage, high speed, high resolution quantization is required. The pipelined analog-to-digital conversion architecture's ability to meet these demands makes it ideal for high volume telecommunications application such as various digital subscriber lines, digital signal processing at video rates, and for stand alone high speed analog-to-digital converters. The advantage of pipelined analog-to-digital conversion is that each stage of resolution is separated. Once the analog signal is resolved at the first stage and the result passed to the second stage, a new signal can be processed by the first stage. The passing of result and signal from stage to stage continues to stage N at which point a digital value of N bits of resolution can be produced. Quantization of the first signal to N bits of resolution is achieved in N cycles of latency.

However, because each stage resolves one bit and passes the result to the next stage, the former stage is free to resolve a bit of the next analog sample. This pipeline design allows N analog samples to be in the process of quantization simultaneously. Once the first analog sample is quantized, after N cycles, each successive analog sample is quantized one cycle later. Thus, a high throughput of one sample per cycle is achieved. Errors can be introduced into the conversion process at different stages by different components. The most common components in analog-to-digital conversion which can cause error are capacitors. Capacitors can introduce error because of a mismatch concerning the capacitance ratio of two or more capacitors used in sampling and amplifying an analog signal. In a conventional switched-capacitor pipelined ADC the accuracy is fundamentally limited by capacitor mismatch and finite amplifier gain.

Various self-calibration techniques have been proposed to address the capacitor mismatch induced by the digital to analog subconverter (DASC) and interstage gain error. Most of these techniques require the normal operation of the converters to be interrupted in order to perform the calibration. This can impose a burden on the user who decides when the converter can be interrupted and when the converter needs be recalibrated due to temperature or other environmental changes. A superior method is to use a background calibration technique whose operation is transparent to the user.

One method of background calibration is to employ an extra pipeline stage that is used to substitute the stage being calibrated. While the ADC is in normal operation, this extra stage is calibrated. One stage of the pipeline is then switched out for calibration while the extra calibrated stage is switched into the pipeline. The drawback with this approach is that in a well designed pipeline, the first few stages, which are the most critical, usually consume more power than later stages. Since the accuracy of the pipeline is determined by the accuracy of the first few stages, the extra stages added for calibration will consume significant amounts of power. In addition, this technique requires an additional successive approximation ADC to measure the error. Although the successive approximation ADC can be low power, it has to consume enough power to be fast enough to track temperature and other environmental changes. Another disadvantage of this technique is that it results in fixed pattern noise due to periodic substitution of stages. Another proposed background calibration scheme requires the addition of a calibration signal to the input. However, this results in a reduction of the useful dynamic range of the converter.

SUMMARY OF INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to systems and methods for calibrating a pipeline Analog-to-Digital Converter (ADC). The present invention employs a slow but accurate ADC or a slow but accurate ideal pipeline stage to correct for the residue errors in a non-ideal pipeline stage. The ideal pipeline stage samples the same input as the non-ideal pipeline stage and determines an ideal residue voltage based on the sampled input. An error function samples the actual residue voltage output and provides an initial residue voltage estimate. The error function maps the actual residue voltage to the ideal residue voltage to compensate for errors (e.g., capacitor mismatch, finite operation amplifier gain error, offsets, charge injection errors) associated with the pipeline stage. A correction algorithm is executed to optimize one or more parameters associated with the error function. The correction algorithm executes iteratively until the initial residue voltage estimate is approximately equal to the actual residue voltage. Upon optimization, the error function with the one or more optimized parameters can be applied to the pipeline stage to compensate for errors associated with the stage.

In one aspect of the invention, the correction algorithm is a gradient-descent least mean square (LMS) approach. A calibration technique that involves the use of a slow-but-accurate ADC in conjunction with an LMS algorithm to find parameters, which correct for the residue errors like finite op-amp gain error, capacitor ratio mismatch and charge injection error in a non-ideal pipeline stage result in a significant improvement in the integral nonlinearity (INL) and differential nonlinearity (DNL) of the ADC. The algorithm can be implemented in digital domain or in the analog domain. The present invention is applicable to a variety of different implementations. One such example is in the area of broadband networks, where a high resolution ADC at the front end enables complex signal processing to be done in the digital domain.

The following description and the annexed drawings set forth certain illustrative aspects of the invention. These aspects are indicative, however, of but a few of the various ways in which the principles of the invention may be employed. Other advantages and novel features of the invention will become apparent from the following detailed description of the invention when considered in conjunction with the drawings.

DETAILED DESCRIPTION OF THE INVENTION

The present invention relates to systems and methods for performing a background calibration technique on one or more stages of a pipeline ADC. The technique employs a slow but accurate ADC or a slow but accurate ideal pipeline stage to correct for the residue errors in a non-ideal pipeline stage using an error function and a correction algorithm. The correction algorithm determines optimal parameters of the error function, so that the error function can be utilized to compensate for errors in the ADC. The correction algorithm and results can be applied in the digital domain or in the analog domain. The calibration technique of the present invention has been shown to potentially correct for the circuit imperfections like finite amplifier gain error, capacitor ratio mismatch error, offsets and charge injection errors.

Figure 1:
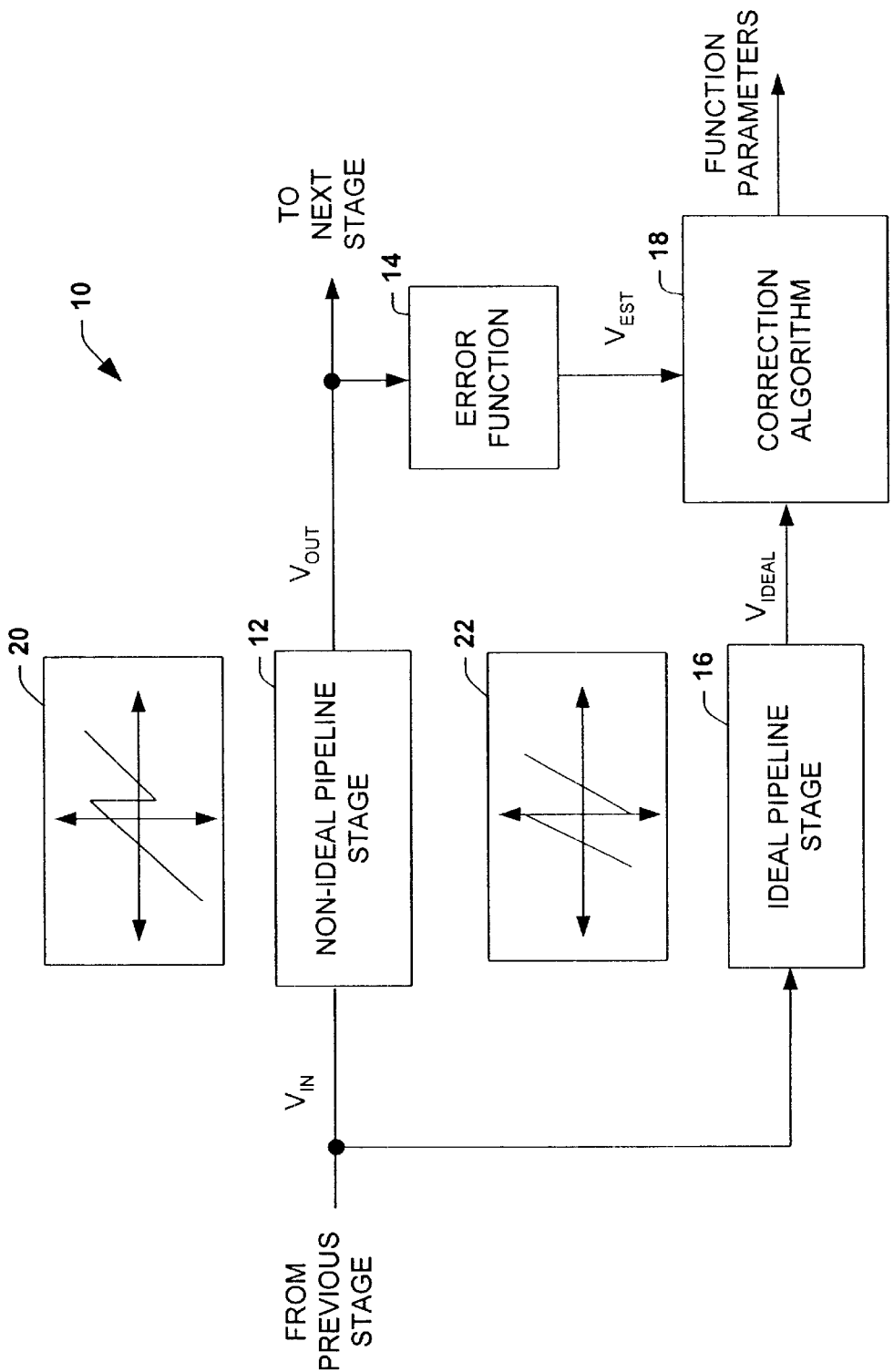
FIG. 1 illustrates a system for calibrating a non-ideal pipeline stage in accordance with an aspect of the present invention.

FIG. 1 illustrates a system for calibrating a non-ideal pipeline stage 12 in accordance with an aspect of the present invention. The system 10 corrects for residue errors in the non-ideal pipeline stage 12 by comparing its residue ($V_{OUT}$) with an ideal estimate ($V_{IDEAL}$) generated using an accurate calibration stage or ideal pipeline stage 16 that receives the same analog input ($V_{IN}$) as the non-ideal stage 12 under calibration. The residue voltage $V_{OUT}$ is then processed using an error function 14, which generates an estimate $V_{EST}$ of the ideal residue voltage. The error function 14 represents a function that maps a residue curve 20 associated with the non-ideal pipeline stage 12 with an ideal residue curve 22 associated with the ideal pipeline stage 16. The aim of the correction algorithm 18 is to find the correct parameters for the error function 14, so that $V_{EST}$ is as close to $V_{IDEAL}$ as possible.

In one aspect of the invention, a gradient-descent least mean square (LMS) approach is used as the correction algorithm 18. Therefore, in order to correct for residue errors in the non-ideal pipeline stage 12, where the correct estimate of the slope and y-intercepts of the residue curve is needed for $V<V_{th}$ and $V \geq V_{th}$, where $V_{th}$ is the bit decision threshold of the comparator in the pipeline stage. Hence, the error function 14 can be a linear function of the residue voltage $V_{OUT}$ of the form, $F(V)=\alpha V+\beta$, where, V is the non-ideal residue voltage $V_{OUT}$ to the error function 14. Two sets of $(\alpha,\beta)$ can be evaluated, one for $V<V_{th}$ and the other for $V>V_{th}$, for each pipeline stage to be calibrated. These parameters are then used during conversion to generate the calibrated digital output.

An error $\epsilon$ between the estimate and the ideal residue voltage for the same input is then given by $V_{IDEAL}-V_{EST}$. The correction algorithm 18 begins with an unknown value for the parameter set $(\alpha,\beta)$, and at every step, computes the mean square error gradient and updates the parameters in the direction of the decreasing gradient. The update algorithm for the parameter set $(\alpha,\beta)$ can be given by:

$$\alpha_{new}=\alpha_{old}+\mu' \epsilon V_{out}$$

$$\beta_{new}=\beta=\beta_{old}\mu'\epsilon$$

The parameter $\mu'$ is the update step size for the gradient descent algorithm. The above algorithm converges to the desired parameter set $(\alpha,\beta)$ such that $\epsilon\sim 0$, $V_{est}\sim V_{ideal}$. For ease of implementation and to eliminate multipliers, a modified sign implementation of the gradient descent algorithm can be employed below:

$$\alpha_{new}=\alpha_{old}+\mu'\text{sgn}(\epsilon)\text{sign}(V_{out}) \qquad \text{EQ. 1}$$

$$\beta_{new}=\beta_{old}\mu'\text{sgn}(\epsilon) \qquad \text{EQ. 2}$$

where, $\text{sgn}(\epsilon)=0$ if, $\epsilon=0$, otherwise $\text{sgn}(\epsilon)=1$ if $\epsilon$ is positive and $\text{sgn}(\epsilon)=-1$ if $\epsilon$ is negative. Otherwise, sign ( ) returns the sign of the argument. As the parameters change slowly with time, calibration can be executed only once in thousands of cycles. This relaxes the speed requirements in the design of the ideal calibration stage 16.

Figure 2:
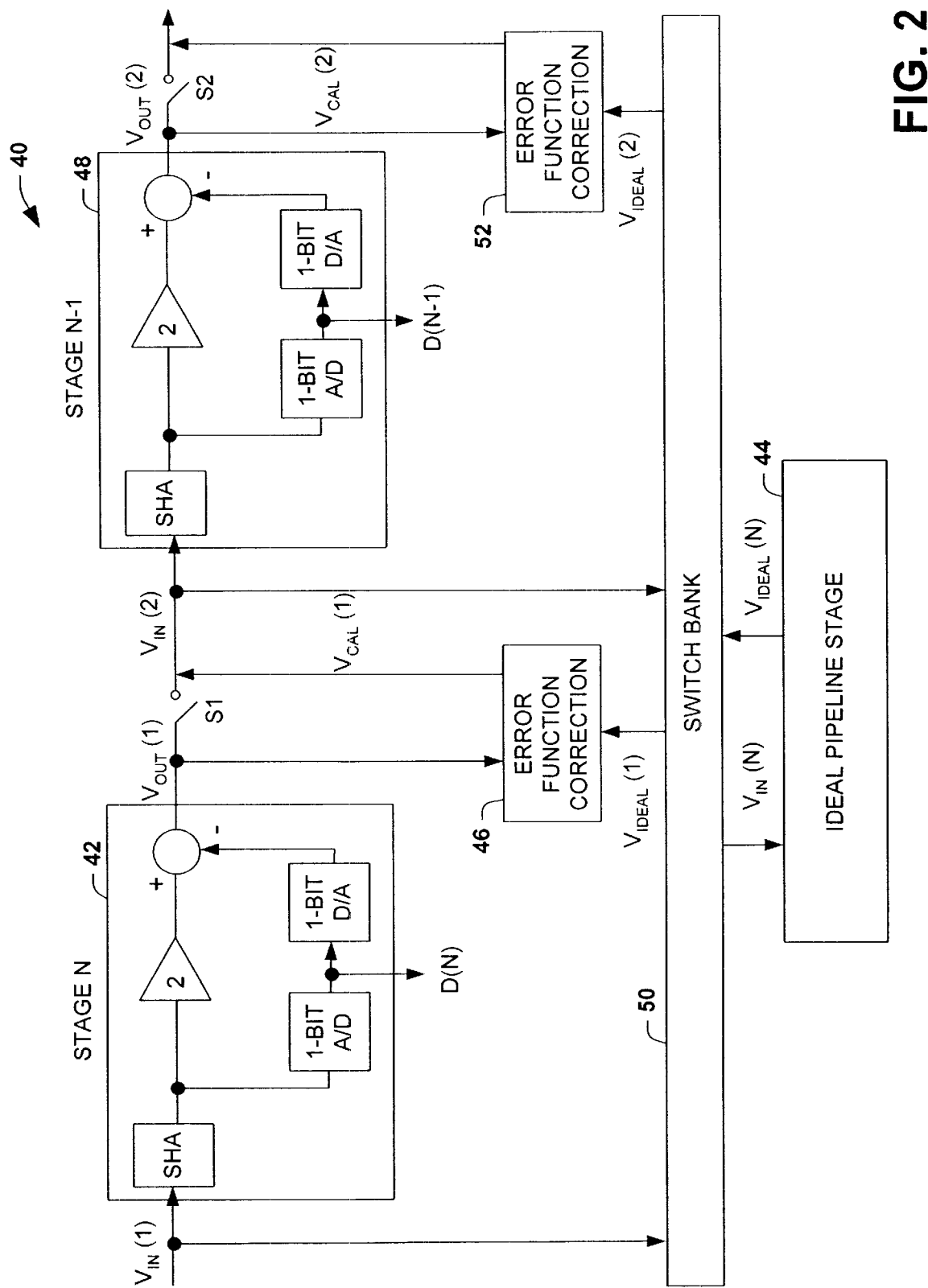
FIG. 2 illustrates a system for calibrating a pipeline ADC with an error function component associated with each pipeline stage in accordance with an aspect of the present invention.

FIG. 2 illustrates a system 40 having an error function correction component associated with each pipeline stage in accordance with an aspect of the present invention. The system 40 is particularly suited for calibrating in the analog domain. FIG. 2 illustrates a portion of a pipeline ADC with a first stage 42 (stage N) coupled to a second stage 48 (stage N−1). The pipeline ADC will include additional stages similar to the first stage 42 and the second stage 48 based on the desired resolution of the pipeline ADC. Each stage is a 1-bit per stage converter that includes a sample-and-hold amplifier (SHA) followed by a one-bit A/D (comparator), a multiply-by-2 gain amplifier, a one-bit D/A converter and an adder/subtractor. A typical configuration of a single stage of pipeline can be a switched capacitor configuration.

The output of every stage is referred to as a residue. Ideally, the residue curve for a 1-bit pipeline stage has a slope of two and a bit decision threshold at the mid-point of the ADC's resolvable input range. However, error is introduced in the residue curve due to finite op-amp gain error and capacitor ratio mismatch. These sources of error result in a deviation of the slope of the residue curve from an ideal value of two. Other sources of error due to charge injection and comparator offsets can be easily corrected by simple analog circuit techniques or by digital correction.

The first stage 42 is associated with a first error function correction component 46, and the second stage 48 is associated with a second error function correction component 52. A single ideal pipeline stage 44 is coupleable to a respective analog input signal $V_{IN}(N)$ and provides a ideal residue voltage $V_{IDEAL}(N)$ to a respective error function correction component through a switch bank 50. Therefore, a plurality of ADC pipeline stages can be calibrated employing the single ideal pipeline stage 44.

During calibration, the ideal pipeline stage 44 receives the analog input signal $V_{IN}(2)$ along with the second stage 48. The ideal pipeline stage 44 generates an ideal residue voltage $V_{IDEAL}(2)$ that is provided to the error function correction component 52 through the switch bank 50 along with the actual residue voltage $V_{OUT}(2)$ of the second stage 48. The error function correction component 52 executes a correction algorithm on an error function that maps the actual residue voltage to the ideal residual voltage to eliminate errors associated with the second stage 48. The correction algorithm determines optimal parameters values associated with applying the error function to the actual residue voltage $V_{OUT}(2)$. Once the optimal parameter values are determined, a switch S2 can be opened such that the actual residue voltage is provided to the error function correction component 52, which applies the optimized error function to the actual residue voltage $V_{OUT}(2)$ to provide a calibrated residue voltage $V_{CAL}(2)$.

After calibrating the second stage 48, the first stage 42 can be calibrated. The ideal pipeline stage 44 receives the analog input signal $V_{IN}(1)$ along with the first stage 42. The ideal pipeline stage 44 generates an ideal residue voltage $V_{IDEAL}(1)$ that is provided to the error function correction component 46 along with the actual residue voltage $V_{OUT}(1)$ of the first stage 42. The error function correction component 46 executes a correction algorithm on an error function that maps the actual residue voltage to the ideal residual voltage to eliminate errors associated with the first stage 42. The correction algorithm determines optimal parameters values associated with applying the error function to the actual residue voltage $V_{OUT}(1)$. Once the optimal parameter values are determined, a switch S1 can be opened such that the actual residue voltage is provided to the error function correction component 46, which applies the optimized error function to the actual residue voltage $V_{OUT}(1)$ to provide a calibrated residue voltage $V_{CAL}(1)$.

It is to be appreciated that calibration can be performed on each stage from the LSB to MSB prior to applying the calibration correction. Additionally, calibration can be eliminated at certain stages (e.g., LSB stages) where the error impact of the capacitor mismatches and infinite operational amplifier gain is insignificant. The calibration correction information can be applied in either the analog or digital domain.

Figure 3:
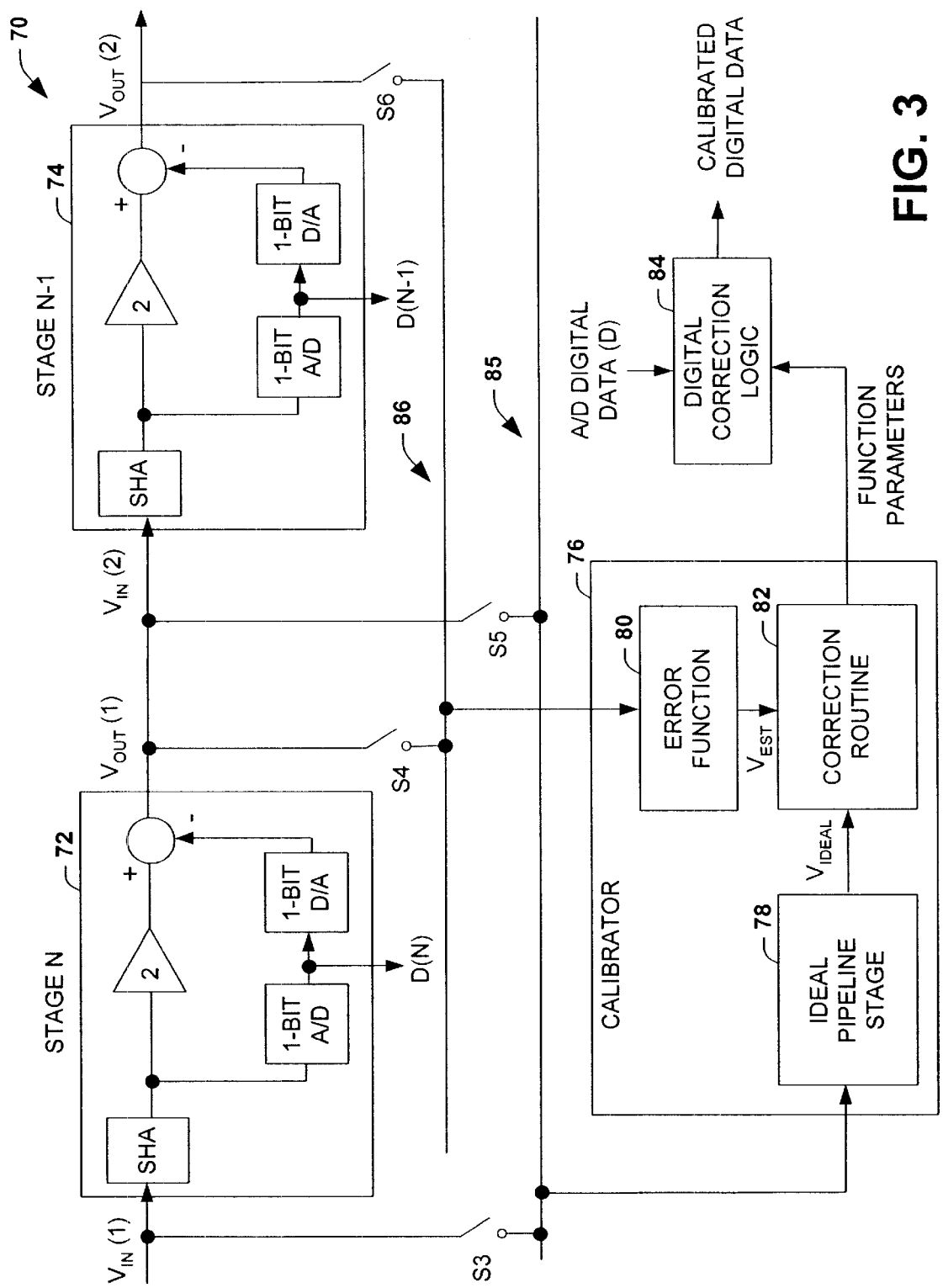
FIG. 3 illustrates a system for calibrating a pipeline ADC with a single error function in accordance with an aspect of the present invention.

FIG. 3 illustrates a system 70 for calibrating a pipeline ADC with a single error function in accordance with an aspect of the present invention. The system 70 is particularly suited for calibrating in the digital domain. FIG. 3 illustrates a portion of a pipeline ADC with a first stage 72 coupled to a second stage 74. The pipeline ADC will include additional stages similar to the first stage 72 and the second stage 74 based on the desired resolution of the pipeline ADC. Each stage is a 1-bit per stage converter that includes a sample-and-hold amplifier (SHA) followed by a one-bit A/D (comparator), a multiply-by-2 gain amplifier, a one-bit D/A converter and an adder/subtractor. It is to be appreciated that the stage can be a multiple bit converter stage.

A single calibrator 76 is provided for calibrating the first stage 72 (stage N), the second stage 74 and other stages (not shown) forming the pipeline ADC, which are to be calibrated. The calibrator 76 includes an ideal pipeline stage 78, an error function 80 and a correction routine 82. A plurality of switches (S3–S6) are provided that coupled the first stage 72 or the second stage 74 to the calibrator 76 through an input bus 85 and an output bus 86. During calibration, the switch S5 and S6 couples the second stage 74 to the calibrator 76. The ideal pipeline stage 78 receives the analog input signal $V_{IN}(2)$ through the input bus 85 and generates an ideal residue voltage $V_{IDEAL}$ that is provided to the correction routine 82. The error function 80 receives the actual residue voltage $V_{OUT}(2)$ of the second stage 74 through the output bus 86.

The error function 80 generates an estimate $V_{EST}$ of the ideal residue voltage and provides this to the correction routine 82. The correction routine 82 executes an algorithm to optimize the parameters associated with the error function by, for example, iterative techniques, such as a gradient-descent LMS approach, until $V_{EST}$ is approximately equal to $V_{IDEAL}$. The parameters are then provided to a digital correction logic component 84. The digital correction logic component 84 stores the function parameters for employing in the modification of the output results of the second stage 74.

After determining calibration parameters for the second stage 74, the second stage 74 is disconnected from the calibrator 76 by opening the switches S5 and S6. The first stage 72 is then connected to the calibrator 76 by closing switches S3 and S4. The ideal pipeline stage 78 receives the analog input signal $V_{IN}(1)$ through the input bus 85 and generates an ideal residue voltage $V_{IDEAL}$ that is provided to the correction routine 82. The error function 80 receives the actual residue voltage $V_{OUT}(1)$ of the first stage 72 through the output bus 86. The error function 80 generates an estimate $V_{EST}$ of the ideal residue voltage and provides this to the correction routine 82. The correction routines 82 executes an algorithm to optimize the parameters associated with the error function until $V_{EST}$ is approximately equal to $V_{IDEAL}$. The parameters are then provided to digital correction logic component 84. The digital correction logic component 84 stores the function parameters for employing in the modification of the output results of the first stage 72.

The digital correction logic component 84 receives the A/D digital data from the pipeline ADC and employs the stored parameters to provide calibrated digital data. The digital correction logic component 84 can combine the evaluated parameters for each stage to provide a single calibration correction mechanism upon completion of a calibration cycle. Alternatively, the individual parameter values can be employed to calibrate the digital data result from the pipeline ADC 70. The parameter values for each stage can be updated at the digital correction logic component 84 upon completing calibration for that stage. The parameter values can then be combined or employed individually upon calibration of a single stage or upon the entire pipeline ADC 70.

Figure 4:
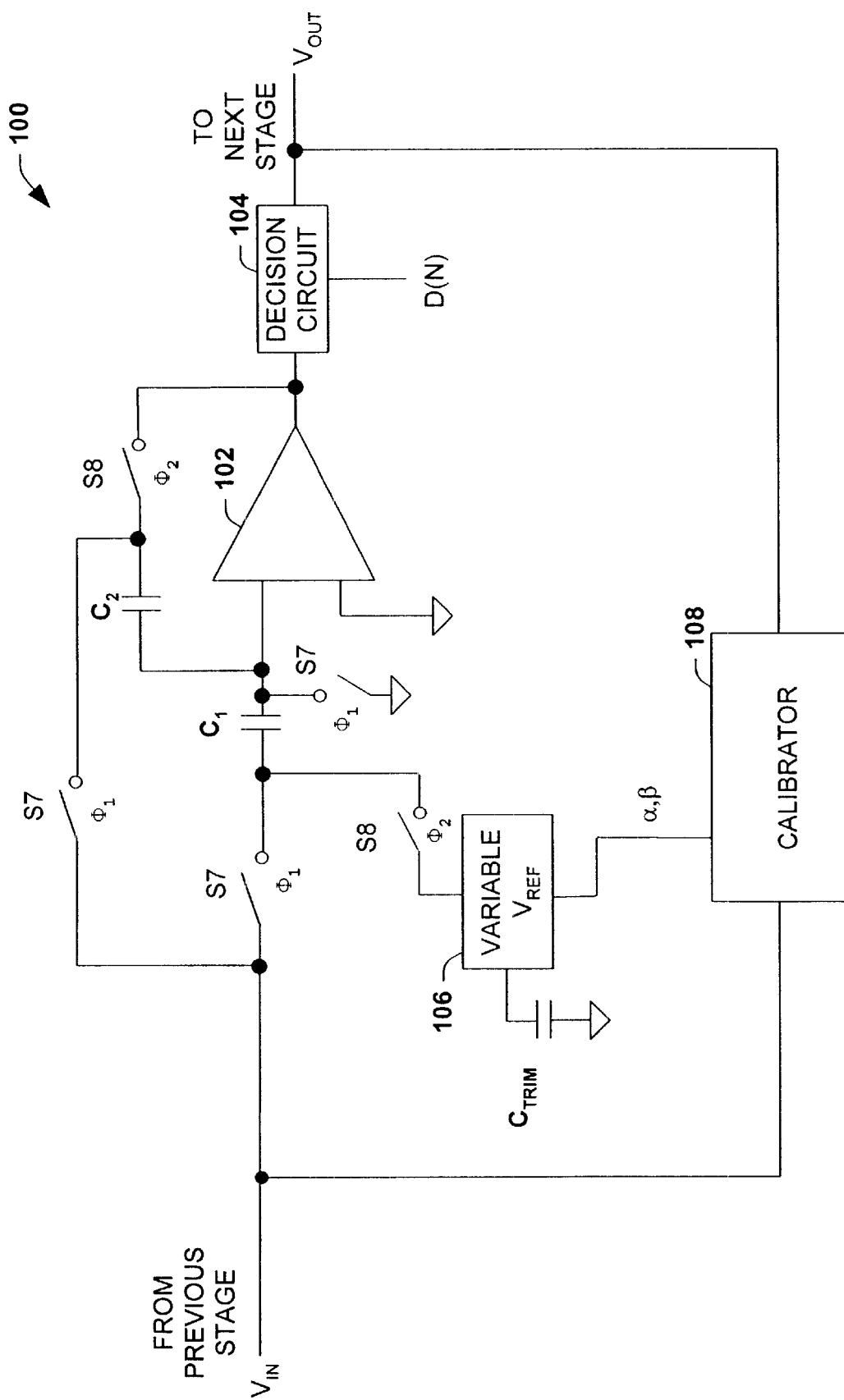
FIG. 4 illustrates an analog domain implementation of the correction mechanism of a one-bit stage switched capacitor pipeline stage in accordance with an aspect of the present invention.

FIG. 4 illustrates an analog domain implementation of the correction mechanism of a one-bit switched capacitor pipeline stage 100 in accordance with an aspect of the present invention. The one bit switched capacitor pipeline stage 100 includes capacitors C1 and C2, an amplifier 102, a first set of switches S7, a second set of switches S8, and a decision circuit 104. During a sampling phase $F_1$, the first set of switches S7 are closed, and the capacitors C1 and C2 are utilized to sample the input signal $V_{IN}$. The analog input is applied to the bottom plates of the sampling capacitors C1 and C2, and the analog input signal is stored on the capacitors as charge. The stage 100 then switches to an amplification stage $F_2$ in which the first set of switches S7 are opened and the second set of switches S8 are closed. During the amplification phase $F_2$, the reference voltage $V_{REF}$ is applied to the capacitor C1, and the amplifier provides a signal corresponding to the input voltage at a decision circuit 104. The decision circuit 104 provides a digital output D (N) and a residue voltage $V_{OUT}$.

During calibration, the input voltage $V_{IN}$ is sampled by a calibrator 108, which determines an ideal residue voltage and the actual residue voltage is sampled to provide an estimated residue voltage as previously discussed. A correction algorithm is generated to optimize parameters associated with an error function. The correction algorithm executes a gradient LMS algorithm to determine a desired parameter set ($\alpha,\beta$) which is provided to a variable reference source 106. The variable reference source provides the reference voltage $V_F$. The gain factor $\alpha$ is utilized by changing the reference voltages of the stage in proportion to the gain parameter. The offset parameter $\beta$ can be implemented by modifying the conventional one-bit switched capacitor circuit by the use of an extra capacitor $C_{TRIM}$ to dump charge proportional to the offset parameter $\beta$ during $F_2$ phase.

Figure 5:
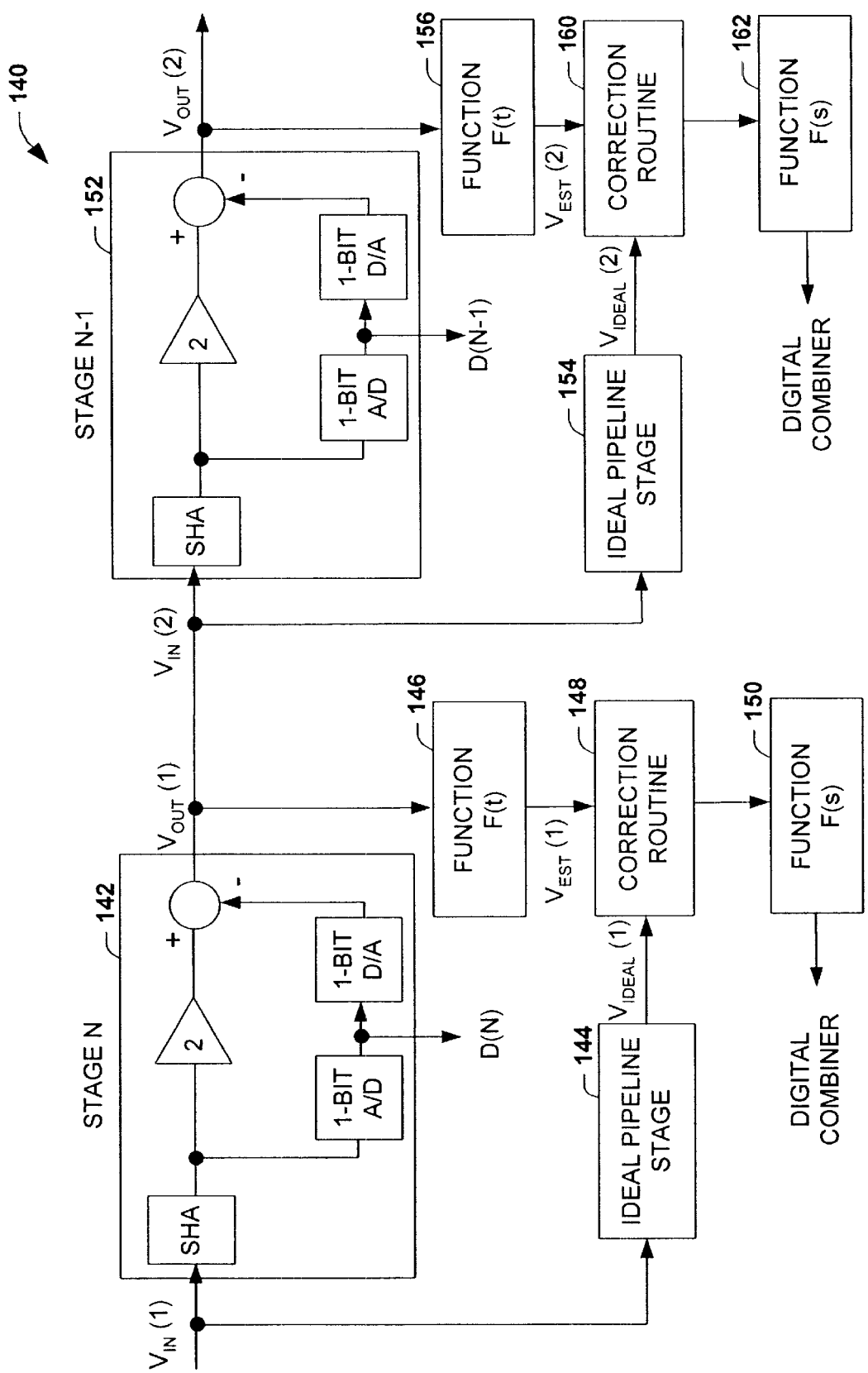
FIG. 5 illustrates a digital domain implementation of the correction mechanism of a pipeline stage in accordance with an aspect of the present invention.

FIG. 5 illustrates digital domain implementation of the correction mechanism of a pipeline stage 140 in accordance with an aspect of the present invention. In the digital domain implementation of the correction mechanism, the correct estimate of the digital output can be computed recursively from the least significant calibrated stage to the MSB calibrated stage, by processing the non-ideal digital output of the pipeline with the set of parameters obtained by calibration. Thus, the whole algorithm for calibration and computation of the output is done in digital domain with the use of few parameters, which requires few multiplications and additions, resulting in minimal hardware.

FIG. 5 illustrates a portion of a pipeline ADC with a first stage 142 (stage N) coupled to a second stage 152 (stage N−1). The pipeline ADC will include additional stages similar to the first stage 142 and the second stage 152 based on the desired resolution of the pipeline ADC. Each stage is a 1-bit per stage converter that includes a sample-and-hold amplifier (SHA) followed by a one-bit A/D (comparator), a multiply-by-2 gain amplifier, a one-bit D/A converter and an adder/subtractor. A typical configuration of a single stage of pipeline can be a switched capacitor configuration.

The first stage 142 (stage N) is associated with a first ideal pipeline stage 144, an error function F(t) 146 and a correction routine 148. The second stage 152 (stage N−1) is associated with a second ideal pipeline stage 154, an error function F(t) 156 and a correction routine 160. During calibration, the second ideal pipeline stage 154 receives the analog input signal $V_{IN}(2)$ along with the second stage 152. The second ideal pipeline stage 154 generates an ideal residue voltage $V_{IDEAL}(2)$ that is provided to the correction routine 160. The error function 156 receives the actual residue voltage $V_{OUT}(2)$ of the second stage 152 and provides an estimated residue voltage $V_{EST}(2)$ to the correction routine 160. The correction routine 160 executes a correction algorithm on the error function 156 that maps the actual residue voltage to the ideal voltage to eliminate errors associated with the second stage 152. The correction algorithm determines optimal parameters values associated with applying the error function to the actual residue voltage $V_{OUT}(2)$. Once the optimal parameter values are determined, the parameters are provided to a second error function F(S) to be applied in the digital domain. The second error function 162 and associated parameters are provided to a digital combiner.

After executing calibration for the second stage 152, the first stage 142 can be calibrated. The first ideal pipeline stage 144 receives the analog input signal $V_{IN}(1)$ along with the first stage 142. The first ideal pipeline stage 144 generates an ideal residue voltage $V_{IDEAL}(1)$ that is provided to the correction routine 148. The error function 146 receives the actual residue voltage $V_{OUT}(1)$ of the first stage 142 and provides an estimated residue voltage $V_{EST}(1)$ to the correction routine 148. The correction routine 148 executes a correction algorithm on the error function 146 that maps the actual residue voltage to the ideal voltage to eliminate errors associated with the first stage 142. The correction algorithm 142 determines optimal parameters values associated with applying the error function to the actual residue voltage $V_{OUT}(1)$. Once the optimal parameter values are determined, and the parameters are provided to a second error function F(S) 150 to be applied in the digital domain. The second error function 150 and associated parameters are provided to the digital combiner.

Figure 6:
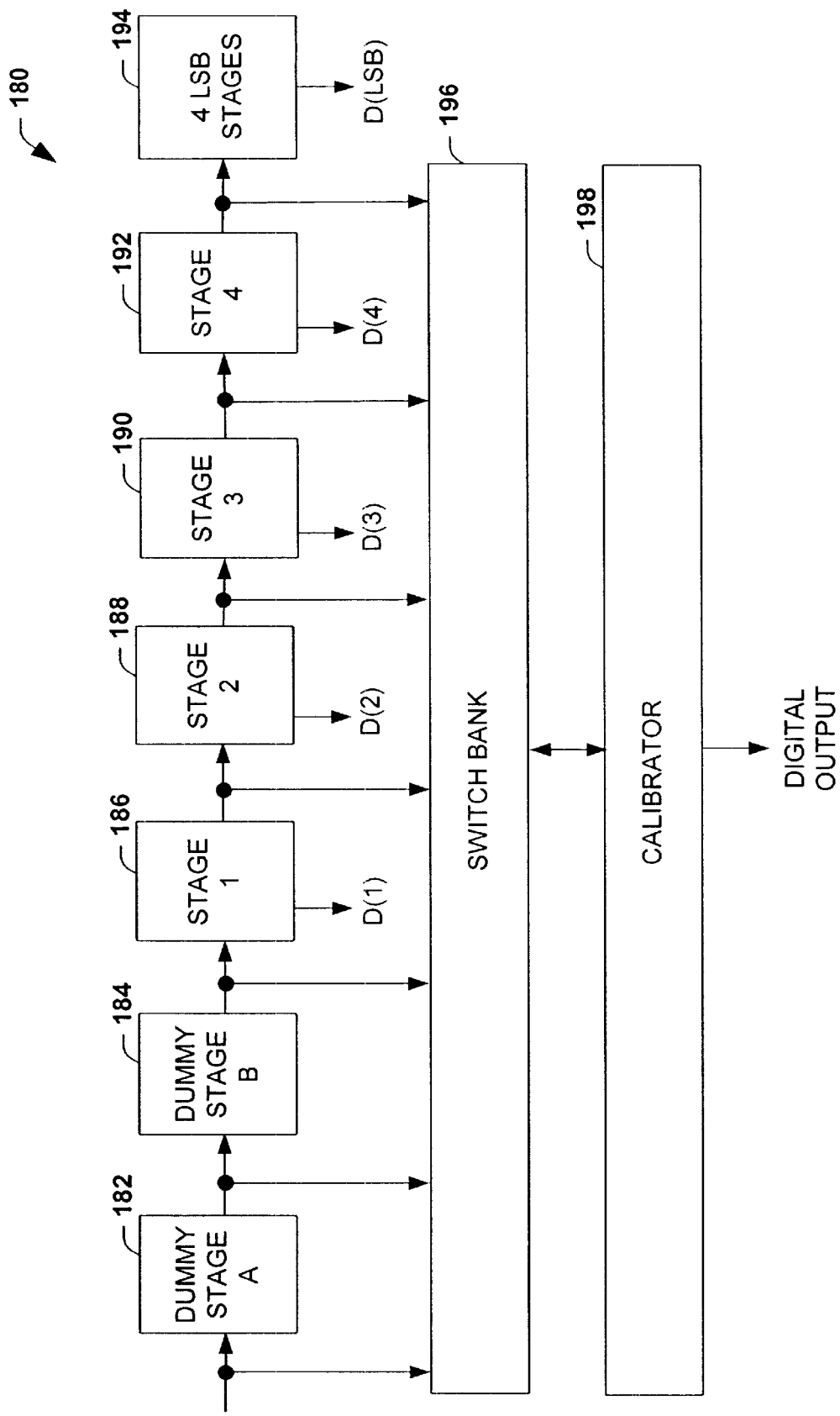
FIG. 6 illustrates a system for calibrating an 8-bit pipeline ADC in accordance with an aspect of the present invention.

FIG. 6 illustrates a system 180 for calibrating an 8-bit pipelined ADC in accordance with an aspect of the present invention. In the example, of FIG. 6, a first 4 LSB stages 194 (stage 5, 6, 7 and 8) are assumed to be ideal for illustration purposes and therefore, do not need to be calibrated. Calibration begins with stage 192 (stage 4) which is the least significant stage to be calibrated. A switch bank 196 switches a slow-but-accurate ADC (e.g., ideal pipeline stage) residing in a calibrator 198 in parallel with the stage 192. The ADC provides a digital word representation of the ideal residue ($V_{IDEAL}$) for the stage under calibration (stage 4). $D_{IDEAL}$ represent such a digital word equivalent of the ideal residue. Since the residue voltage from stage 4 is sampled as input by the following stages, the digital equivalent of the residue output of stage 4 can be given by the word $D_5D_6D_7D_8$. The gradient descent algorithm can now be used to estimate the parameters ($\alpha_4$, $\beta_4$) of the function block F(=$f_4$) for stage 4 using the above digital word equivalents for the residues. Once the parameters for stage 4 are obtained, the next most significant stage 190 (stage 3) is calibrated.

The slow-but-accurate ADC residing in the calibrator 198 is now connected in parallel with stage 190 (stage 3). The backend of the pipeline consists of a calibrated non-ideal stage 4 and the ideal stages 5, 6, 7 and 8. Therefore, the digital equivalent of the residue of stage 3, is equal to the value $2^4(D_4+f_4D_5D_6D_7D_8)$. $D_{IDEAL}$ gives the digital word equivalent of the ideal residue for stage 190 (stage 3) computed using the slow-but-accurate ADC. The gradient descent approach is now used to estimate the parameter set ($\alpha_3,\beta_3$) of the function block F(=$f_3$) for stage 190. Once the parameters are obtained, the above process is repeated, in turn for stage 188 (stage 2) and stage 186 (stage 1), respectively. It is to be appreciated that even if the stages 5, 6, 7 and 8 are similar to the non-ideal stages, earlier in the pipeline, the calibration algorithm works successfully. However, the accuracy of the parameter set depends on the resolution of the residue, which is quantized by the following stages in a pipeline. Therefore, a first dummy stage 182 and a second dummy stage 184 are provided at the end of the pipeline 180. The above algorithm for calibration is run in background along with the normal conversion. Once the parameters are estimated, a correction mechanism can be implemented in either the analog domain or in the digital domain.

Figure 7:
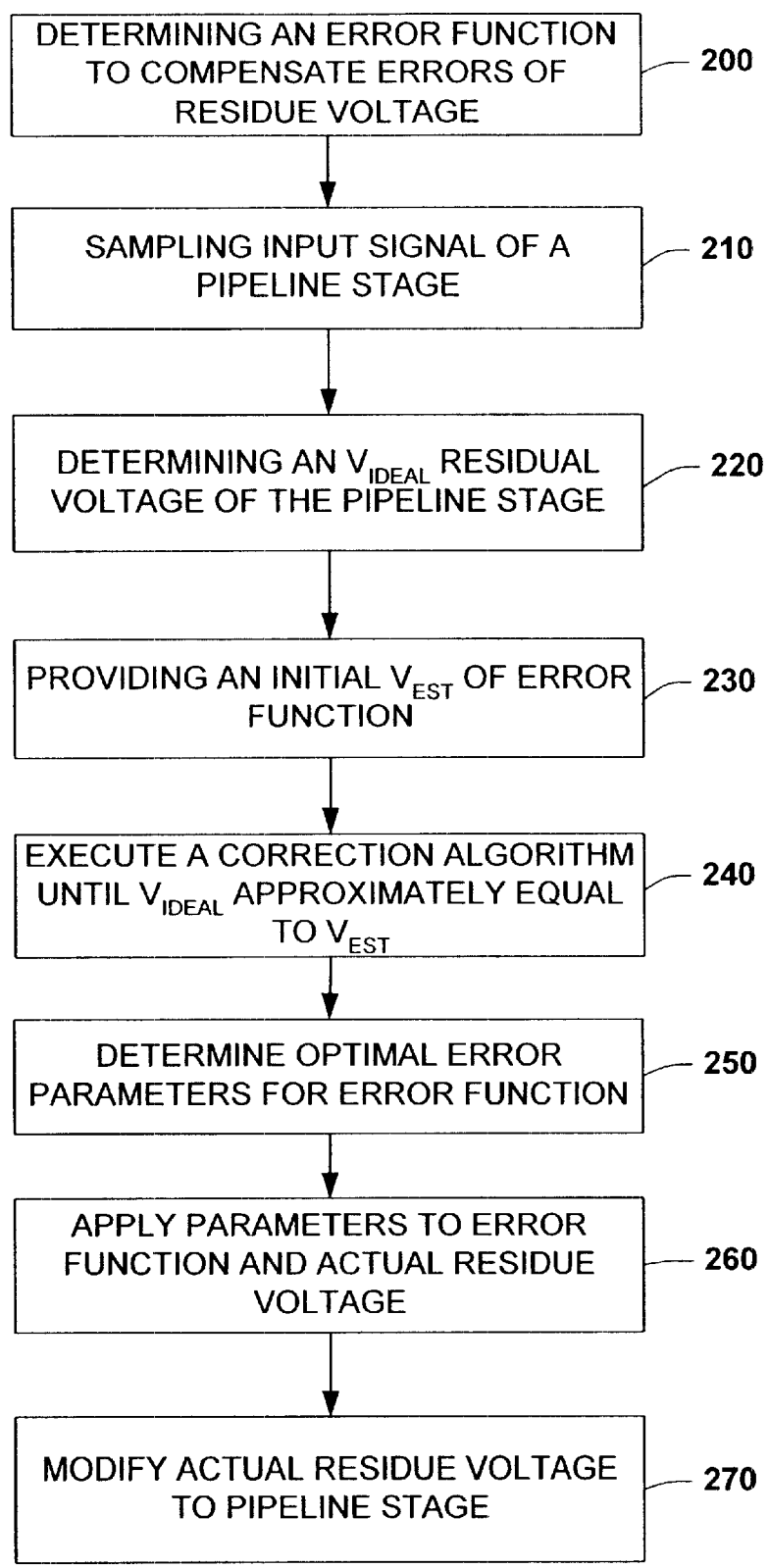
FIG. 7 illustrates a flow diagram of a methodology for performing a background calibration technique in accordance with an aspect of the present invention.

In view of the foregoing structural and functional features described above, a methodology in accordance with various aspects of the present invention will be better appreciated with reference to FIG. 7. While, for purposes of simplicity of explanation, the methodology of FIG. 7 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 7 illustrates one particular methodology for calibrating a stage of a pipeline ADC in accordance with an aspect of the present invention. The methodology begins at 200 where an error function is determined that compensates for errors associated with residue voltage. At 210, an input signal to a non-ideal pipeline stage is sampled. The methodology then proceeds to 220. At 220, the methodology determines an ideal residual voltage of the pipeline stage employing the sampled input signal. The ideal residual voltage is then provided to a correction algorithm. At 230, an initial estimate $V_{EST}$ of the error function is provided to the correction algorithm. The correction algorithm is then executed until $V_{EST}$ is approximately equal to $V_{IDEAL}$. The correction algorithm can execute a gradient-descent least mean square (LMS) approach as discussed in FIG. 1. The optimal error parameters of the error function are then determined at 250. At 260, the optimal error parameters to the error function are applied to the actual residue voltage. The methodology then proceeds to 270. At 270, the actual residue voltage to the pipeline is modified. The above methodology is then repeated for each stage of the pipeline ADC.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for calibrating a pipeline Analog-to-Digital converter (ADC), the system comprising:
    an ideal pipeline stage that receives an input voltage of a pipeline stage and provides an ideal residue voltage;
    an error function that receives a residue voltage of the pipeline stage and provides a residue voltage estimate; and
    a correction algorithm that optimizes at least one parameter associated with the error function, so that the residue voltage estimate is approximately equal to the ideal residue voltage.

2. The system of claim 1, the correction algorithm executes a gradient-descent least mean square approach to optimize the at least one parameter.

3. The system of claim 1, the correction algorithm optimizes a first parameter that represents the capacitor mismatch and finite operational amplifier gain error of the stage and a second parameter that represents the offset of the stage.

4. The system of claim 1, the ideal pipeline stage, the error function and the correction algorithm being employed to calibrate a plurality of stages of the pipeline ADC.

5. The system of claim 1, further comprising a plurality error functions such that each error function is associated with a single stage of the pipeline ADC, such that the ideal pipeline stage, the correction algorithm and the associated error function are employed to calibrate an associated pipeline stage.

6. The system of claim 1, the pipeline stage being a single bit per stage converter in a switched capacitor configuration.

7. The system of claim 1, the error function with the at least one optimized parameter maps the actual residue voltage to the ideal residue voltage to compensate for errors associated with the pipeline stage.

8. The system of claim 1, further comprising a switch that switches a calibrated residue voltage from the error function to the pipeline stage output.

9. The system of claim 1, the error function with the at least one optimized parameter is applied in the analog domain.

10. The system of claim 9, the at least one optimized parameter being a first parameter that represents the capacitor mismatch and finite operational amplifier gain error of the stage and a second parameter that represents the offset of the stage, the first parameter determines a value of a variable reference voltage to be applied to the stage and the second parameter determines an amount of charge to be discharged through a trimming capacitor.

11. The system of claim 1, the error function with the at least one optimized parameter is applied in the digital domain.

12. A system for calibrating a pipeline Analog-to-Digital converter (ADC) having a plurality of pipeline stages, the system comprising:
    a calibrator comprising an ideal pipeline stage that receives an input voltage of a pipeline stage, and an error function correction component that receives a residue voltage of the pipeline stage, the ideal pipeline stage provides an ideal residue voltage to the error correction component which optimizes at least one parameter associated with an error function that can be applied to the pipeline stage to compensate for errors associated with the pipeline stage; and a switch bank that switches the calibrator amongst the plurality of stages for performing calibration associated with a respective stage.

13. The system of claim 12, the calibrator calibrates the plurality of stages in order from the least significant bits to the most significant bits of the pipeline ADC.

14. The system of claim 13, the calibrator eliminates calibration at stages where the error impact due to capacitor mismatches and finite operational amplifier gain error is insignificant.

15. The system of claim 12, the pipeline ADC being an 8-bit pipeline ADC.

16. The system of claim 15, further comprising at least one dummy stage to facilitate the accuracy of calibration of the pipeline ADC.

17. The system of claim 12, the error correction component executes a gradient-descent least mean square approach to optimize the at least one parameter.

18. The system of claim 12, the calibrator determining the digital word equivalent of the ideal residue for each stage calibrated.

19. A system for calibrating a pipeline Analog-to-Digital converter (ADC), the system comprising:

means for determining an ideal residue voltage from an input voltage of a pipeline stage;

means for providing a residue voltage estimate of an error function; and means for optimizing at least one parameter associated with the error function, so that the residue voltage estimate is approximately equal to the ideal residue voltage.

20. The system of claim 19, further comprising means for applying the error function and the at least one optimized parameter to compensate for errors associated with the pipeline stage.

21. The system of claim 20, the means for applying the error function and the at least one optimized parameter being applied in the analog domain.

22. The system of claim 20, the means for applying the error function and the at least one optimized parameter being applied in the digital domain.

23. A background calibration method for calibrating a pipeline Analog-to-Digital Converter (ADC), the method comprising:

sampling an input signal to a pipeline stage;

determining an ideal residual voltage of the pipeline stage;

providing an initial residual voltage estimate of an error function;

executing a correction algorithm to optimize at least one parameter of the error function; and applying the error function with the at least one optimized parameter to the pipeline stage to correct for errors associated with the pipeline stage.

24. The method of claim 23, the executing a correction algorithm comprising executing a gradient-descent least mean square routine to optimize the at least one parameter until the estimated residual voltage is approximately equal to the ideal residual voltage.

25. The method of claim 24, the at least one parameter being a first parameter representing the capacitor mismatch and finite operational amplifier gain error of the stage and a second parameter representing the offset of the stage.

26. The method of claim 23, the applying the error function with the at least one optimized parameter to correct for errors associated with the pipeline stage being applied to the actual residual voltage to provide a calibrated residual voltage.

27. The method of claim 23, the applying the error function with the at least one optimized parameter to correct for errors associated with the pipeline stage being applied to the digital output of the pipeline stage.

28. The method of claim 23, being applied to a plurality of pipeline stages forming the ADC.

* * * * *